US010262845B2

(12) United States Patent
Gardner et al.

(10) Patent No.: US 10,262,845 B2
(45) Date of Patent: Apr. 16, 2019

(54) SYSTEM AND METHOD FOR ENHANCED ION PUMP LIFESPAN

(71) Applicant: Hamilton Sundstrand Corporation, Charlotte, NC (US)

(72) Inventors: Ben D. Gardner, Colton, CA (US); David E. Burchfield, Rancho Cucamonga, CA (US)

(73) Assignee: HAMILTON SUNDSTRAND CORPORATION, Charlotte, CT (US)

( * ) Notice: Subject to any disclaimer, the term of this patent is extended or adjusted under 35 U.S.C. 154(b) by 188 days.

(21) Appl. No.: 14/874,165

(22) Filed: Oct. 2, 2015

(65) Prior Publication Data

US 2016/0233063 A1 Aug. 11, 2016

Related U.S. Application Data

(63) Continuation-in-part of application No. 14/618,814, filed on Feb. 10, 2015.

(51) Int. Cl.
*H01L 41/12* (2006.01)
*H01J 41/12* (2006.01)
*H01J 41/18* (2006.01)

(52) U.S. Cl.
CPC .............. *H01J 41/12* (2013.01); *H01J 41/18* (2013.01)

(58) Field of Classification Search
CPC .................................. H01J 41/12; H01J 41/18
See application file for complete search history.

(56) References Cited

U.S. PATENT DOCUMENTS 2,488,452 A 11/1949 Van Overbeek
3,070,719 A 12/1962 Jepsen
3,107,844 A 10/1963 Hall
3,112,864 A 12/1963 Sugg
3,161,802 A 12/1964 Jepsen
3,299,311 A 1/1967 Meyerer
(Continued)

FOREIGN PATENT DOCUMENTS

DE 1489231 9/1969
DE 1489227 7/1970
(Continued)

OTHER PUBLICATIONS

First Action Interview Pilot Program Pre-Interview Communication dated Apr. 21, 2017 in U.S. Appl. No. 14/618,814.
(Continued)

*Primary Examiner* — Nimeshkumar D Patel
*Assistant Examiner* — Jacob R Stern
(74) *Attorney, Agent, or Firm* — Snell & Wilmer L.L.P.

(57) ABSTRACT

Within an ion pump, accelerated ions leave the center portion of an anode tube due to the anode tube symmetry and the generally symmetrical electric fields present. The apparent symmetry within the anode tube may be altered by making the anode tube longitudinally segmented and applying independent voltages to each segment. The voltages on two adjacent segments may be time varying at different rates to achieve a rasterizing process. In various embodiments, one or more wire internal to the anode structure and having a time-varying electric potential may alter the trajectory of the ions leaving the anode tube, as may the shape of the anode near the ends of the anode tube.

20 Claims, 7 Drawing Sheets

(56) References Cited

U.S. PATENT DOCUMENTS

| | | | | |
|---|---|---|---|---|
| 3,310,226 | A | 3/1967 | Sibley | |
| 3,319,875 | A | 5/1967 | Jepsen | |
| 3,327,931 | A | 6/1967 | Hall | |
| 3,416,722 | A | 12/1968 | Helmer | |
| 3,460,745 | A | 8/1969 | Hall | |
| 3,531,675 | A | 9/1970 | Frankland | |
| 3,687,665 | A | 8/1972 | Frankland | |
| 4,361,472 | A | 11/1982 | Morrison, Jr. | |
| 4,701,623 | A | 10/1987 | Beasley | |
| 4,835,399 | A | 5/1989 | Hosaka | |
| 5,138,169 | A | 8/1992 | Yamazaki | |
| 5,340,983 | A | 8/1994 | Deinzer | |
| 5,646,488 | A * | 7/1997 | Warburton | G21K 1/10 315/111.21 |
| 5,811,820 | A | 9/1998 | Kirchner | |
| 5,864,137 | A | 1/1999 | Becker | |
| 6,403,952 | B2 * | 6/2002 | Whitehouse | H01J 49/063 250/288 |
| 6,417,511 | B1 | 7/2002 | Russ, IV | |
| 8,933,397 | B1 | 1/2015 | Hanson | |
| 9,613,788 | B2 | 4/2017 | Welkie | |
| 9,704,701 | B2 | 7/2017 | Ibrahim | |
| 2002/0088940 | A1 | 7/2002 | Watanabe | |
| 2003/0132379 | A1 | 7/2003 | Li | |
| 2004/0062659 | A1 * | 4/2004 | Sinha | H01J 41/12 417/50 |
| 2005/0155624 | A1 | 7/2005 | Lee | |
| 2011/0192969 | A1 | 8/2011 | Verentchikov | |
| 2014/0169986 | A1 * | 6/2014 | Conrad | F15D 1/0075 417/48 |
| 2016/0233062 | A1 | 8/2016 | Gardner et al. | |

FOREIGN PATENT DOCUMENTS

| | | | | |
|---|---|---|---|---|
| DE | 2346841 | | 5/1975 | |
| DE | 2362203 | | 6/1975 | |
| EP | 2937891 | | 10/2015 | |
| EP | 2937891 | A1 * | 10/2015 | F04B 19/006 |

OTHER PUBLICATIONS

First Action Interview Office Action Summary dated Aug. 11, 2017 in U.S. Appl. No. 14/618,814.
Extended European Search Report dated Jun. 24, 2016 in European Application No. 16154860.7.
Gardner et al, U.S. Appl. No. 14/618,814, filed Sep. 1, 2015 and entitled "System and Method for Enhanced Ion Pump Lifespan".
USPTO, Preinterview First Office Action dated Jul. 28, 2017 in U.S. Appl. No. 14/618,814.
USPTO, Non Final Office Action dated Nov. 2, 2017 in U.S. Appl. No. 14/618,814.
USPTO, Final Office Action dated Apr. 19, 2018 in U.S. Appl. No. 14/618,814.
USPTO, Advisory Action dated Jun. 12, 2018 in U.S. Appl. No. 14/618,814.
USPTO, Non-Final Office Action dated Oct. 1, 2018 in U.S. Appl. No. 14/618,814.

* cited by examiner

SYSTEM AND METHOD FOR ENHANCED ION PUMP LIFESPAN

CROSS-REFERENCE TO RELATED APPLICATIONS

This application is a continuation-in-part of, claims priority to and the benefit of, U.S. Ser. No. 14/618,814 filed Feb. 10, 2015 and entitled "SYSTEM AND METHOD FOR ENHANCED ION PUMP LIFESPAN," which is incorporated herein by reference in its entirety.

FIELD

The present disclosure relates to ion pump systems and their components.

BACKGROUND

Mass spectrometers operate in a vacuum environment that requires a pumping mechanism to establish and maintain low pressure. In various pumping methodologies, a mass spectrometer may use an ion pump (see prior art FIG. 1) to achieve the internal vacuum associated with proper operation. The ion pump may achieve vacuum by ionizing molecules that drift into a cylindrical anode, then driving them to a cathode surface using an electric field. The ions thus sequestered in the cathode material may be removed from the vacuum space, and consequently, the pressure within the mass spectrometer may be reduced.

The ion pump is a limited-life item due to, for instance, degradation of a cathode surface occurring as a consequence of ion bombardment. An increased ion pump life is desired for many mass spectrometer applications, especially for applications involving remote sensing where the mass spectrometer is not easily accessed or serviced. Consequently, improvements to the manner in which the cathode surface is consumed should increase the lifetime and durability of the ion pump. This patent describes one or more manner in which the cathode lifetime may be extended.

SUMMARY

The present disclosure relates to ion pump systems and their components. According to various embodiments, an ion pump system is disclosed. The ion pump system may comprise a generally cylindrical anode tube and cathode plates. The ion pump system may comprise a plurality of deflection plates. The plurality of deflection plates may be configured to steer a trajectory of an accelerated ion off the mechanical center axis of the anode tube.

The anode tube may comprise a first pair of integrally formed deflection plates and a second pair of integrally formed deflection plates. The first pair of integrally formed deflection plates may be associated with a different voltage than a voltage applied to the second pair of integrally formed deflection plates at a given time. An alternating current (AC) may be applied to at least one of the first pair of integrally formed deflection plates or the second pair of integrally formed deflection plates. The first pair of integrally formed deflection plates and the second pair of integrally formed deflection plates are substantially equivalent in size and shape.

According to various embodiments, the anode tube comprises three integrally formed deflection plates. According to various embodiments, the plurality of deflection plates are disposed between an end of the generally cylindrical anode tube and a cathode plate. According to various embodiments, a first current carrying wire and a second current carrying wire are positioned within an anode tube and configured to change a local electric field and the trajectory of accelerated ions. According to various embodiments, the anode tube comprises a heterogeneous shape. According to various embodiments, a cathode plate of an ion pump comprising a front surface, a back surface, and additional material extending in the Z axis from at least one of the front surface or the back surface is disclosed. The additional material is contained within a footprint formed by an open end of an anode tube along an axis. The additional material may form a substantially symmetrical shape along an axial center axis in the Z direction. The axial center axis is collocated with the mechanical axial center axis of an anode tube. The axial center axis is asymmetric with the mechanical axial center axis of an anode tube. The position of the axial center axis is configured to change a local electric field and the trajectory of accelerated ions over time. The additional material is integrally formed with the cathode plate. The additional material is configured to extend the lifespan of the ion pump.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration and their best mode. While these exemplary embodiments are described in sufficient detail to enable those skilled in the art to practice the disclosure, it should be understood that other embodiments may be realized and that logical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step.

The present disclosure relates to ion pump systems and their components. According to various embodiments and with reference to FIG. 2A, an ion pump system is depicted. The ion pump may comprise a series of generally cylindrical tubes referred to herein as anode tubes 200. A positive 4,000 Volt bias may be applied to each anode tube 200. The anode tubes 200 may be arranged in an array, such as a one by four or a two by four array. A cathode plate 250 in close proximity to an end of the anode tube may be held at a ground voltage.

Under normal operation of the ion pump, molecules drift into an open cylindrical anode, such as an anode tube having a high voltage potential. Electrons generated via the Penning effect ionize the molecules, which then accelerate toward a cathode surface. Upon impact, the ion may be sequestered in the cathode. At the same time, they may also cause ejection of material from the cathode surface. Over time, enough material is ejected to create a pit in the cathode, and eventually a hole may be drilled through the cathode, rendering it useless. If the drilling continues, it is possible to breach the vacuum housing behind the cathode and cause an ion pump failure.

The tightly focused ion beam comes out the axial center of the anode tube with minimal dispersion. This is why the burned-through portion of the cathode may be aligned with the axial center of the anode tube and result in a small footprint as compared with the diameter of the anode tube.

According to various embodiments, the ion beam is manipulated such that a wide footprint of the cathode surface is impacted. Dispersing the striking path of the electrons on the order of ½ of the conventional non-dispersed striking path may triple the life of the cathode surface and in turn extend the lifespan of the ion pump system.

Figure 1:
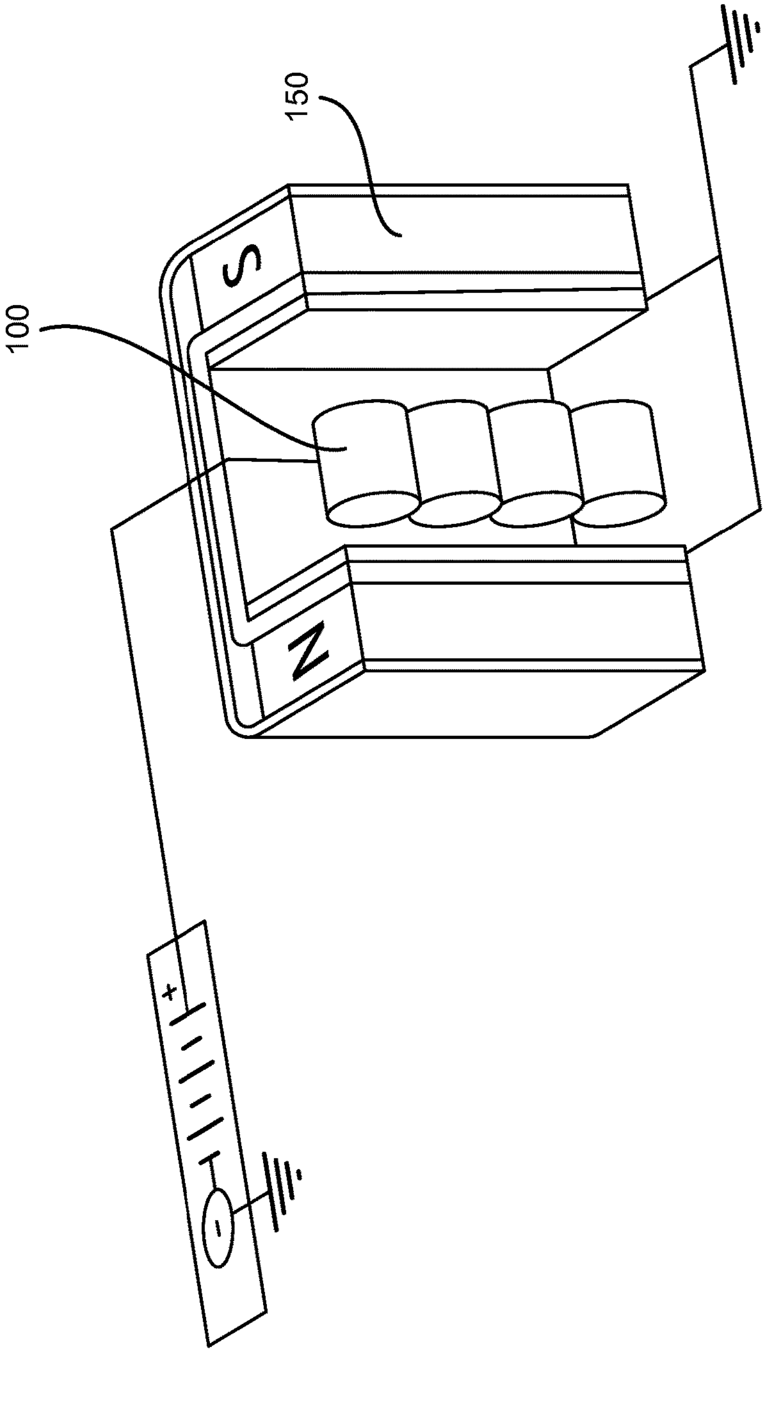
FIG. 1 depicts a prior art ion pump system.

With renewed reference to FIG. 1, as the accelerated ions are generally accelerated along the mechanical center axis of the anode tube 100, a greater percentage of the accelerated ions strike proximate this axis. Over time, a dimple may be formed in the cathode plate 150 generally centered along this axis for each anode tube 100. Thus, in the case of 8 anode tubes, 8 dimples may be formed in the cathode plate 150. This dimple may increase in depth until it progresses through the cathode plate 150. Manipulating the accelerated ions' path of travel may result in an increased lifespan for the cathode plate 150 and ion pump.

This manipulation may be achieved by either steering the accelerated ion and/or passively defocusing the path of travel of the accelerated ion. This manipulation may be achieved in a variety of ways.

Figure 2A:
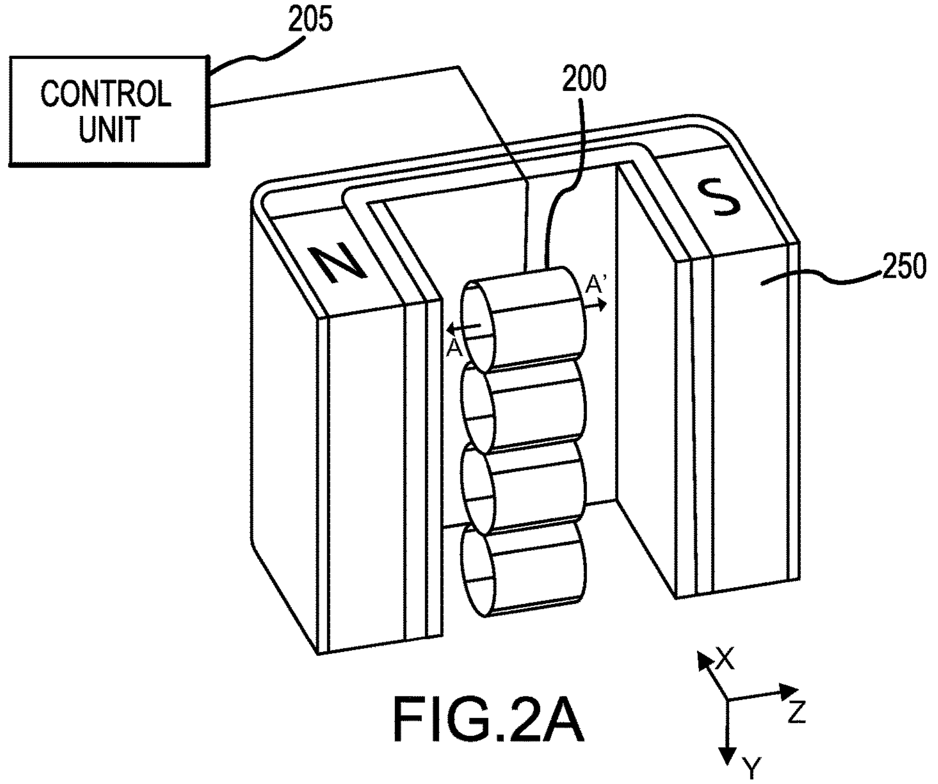
FIG. 2A depicts an isometric view of an ion pump system in accordance with various embodiments.
Figure 2B:
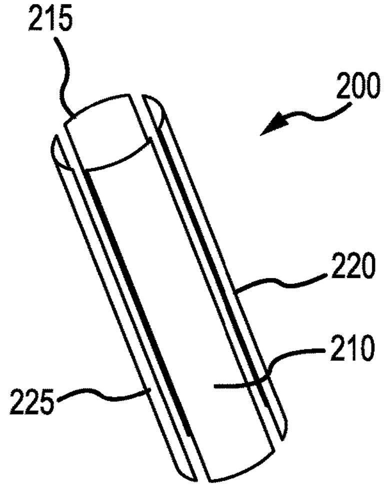
FIG. 2B depicts an isometric view of an ion pump anode tube in accordance with various embodiments.
Figure 2C:
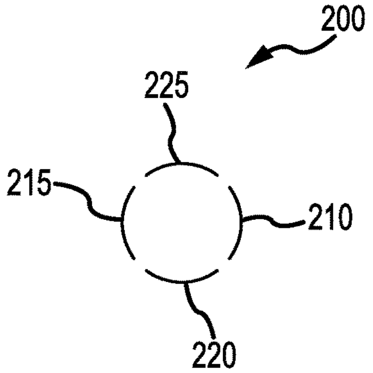
FIG. 2C depicts an end view of an ion pump anode tube of FIG. 2B in accordance with various embodiments.

According to various embodiments and with renewed reference to FIGS. 2A, 2B and 2C, the anode tube 200 may be sectioned. The anode tube 200 may be sectioned into deflection plates. For instance, the anode tube 200 may be sectioned into a pair of deflection plates. For instance, the generally cylindrical anode tube 200 may be comprised of 4 substantially equal sized sections, (e.g., first section 210, second section 215, third section 220 and fourth section 225). A constant positive 4,000 Volts may be applied to each deflection plate, first section 210, second section 215, third section 220 and fourth section 225 via a power source and/or control unit 205 coupled to each anode tube 200. A small time variant field, such as an AC field of 100 Volts plus or minus from the reference voltage, (e.g., 4,000 Volts), may be applied between a pair of deflection plates, such as between first section 210, and second section 215 and/or between third section 220 and fourth section 225 via the power source and/or control unit 205 coupled to each anode tube 200. This AC field may be applied at any frequency, such as 60 Hz. The position of the ion within the anode tube along with the electric field at that location based on the frequency of the AC field and the reference voltage may determine a trajectory of the accelerated ion. In response to statically altering the potential on one of an opposing pair of deflection plates, the ions will move the center axis off the physical center axis (e.g., A-A') of that anode tube 200. Thus, the ions path of travel will be altered from being collated with the physical center axis of the anode tube. In this way, a time varying field, such as an alternating current field, may be applied to each pair of deflection plates, such as between first section 210, and second section 215 and/or between third section 220 and fourth section 225 at different times. Thus, there is a high probability that an ion formed and ejected through the anode tube 200 will not see the exact same electric field as a different ion formed in anode tube 200 and ejected at a different time. Consequently, the vector of the ejected ion will strike cathode plate 250 at a different location than an ion formed at a later time. Thus, the accelerated ion will strike the cathode plate 250 in a generally random pattern with respect to the X and Y axis, in contrast to along a central axis of the anode tube as was common in conventional systems such as the ion pump depicted in FIG. 1.

Accelerated ions leave the center portion (near axis A-A') of the anode tube 200 due to the anode tube 200 symmetry and the generally symmetrical electric fields present. The apparent symmetry within the anode tube 200 may be altered by making the anode tube 200 longitudinally segmented and applying independent voltages to each segment, such as between first section 210, and second section 215 and/or between third section 220 and fourth section 225. The voltages on two adjacent segments may be time varied at different rates to achieve the same rasterizing process described above.

Figure 3A:
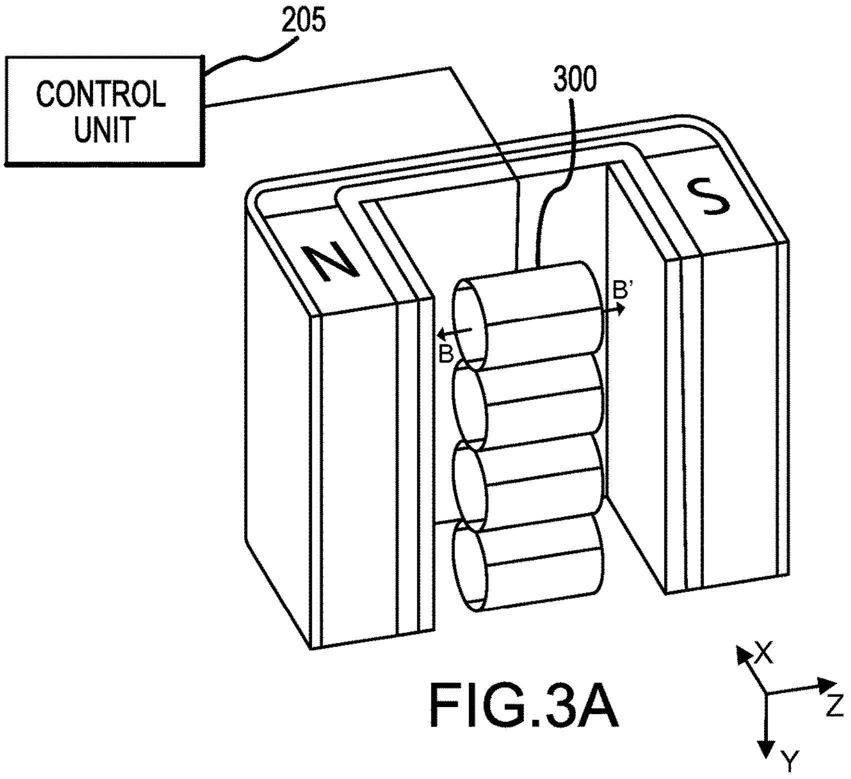
FIG. 3A depicts an isometric view of an ion pump system in accordance with various embodiments.
Figure 3B:
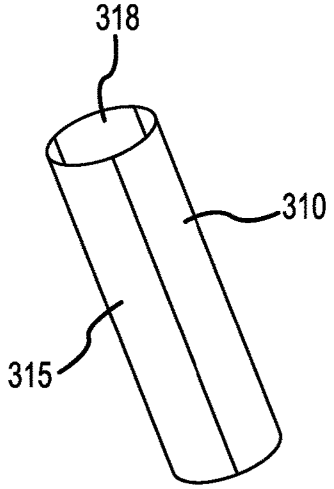
FIG. 3B depicts an isometric view of an ion pump anode tube in accordance with various embodiments.
Figure 3C:
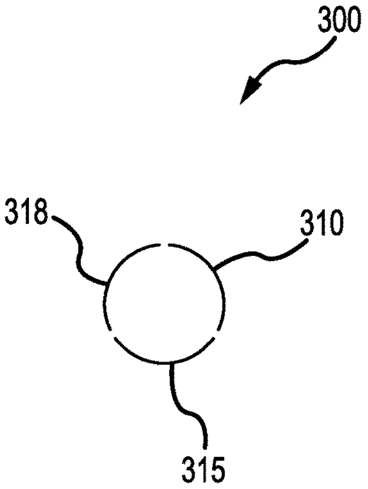
FIG. 3C depicts an end view of an ion pump anode tube of FIG. 3B in accordance with various embodiments.

According to various embodiments and with reference to FIGS. 3A, 3B, and 3C, an anode tube 300 may be sectioned into a set of three deflection plates, a first deflection plate 310, a second deflection plate 315 and a third deflection plate 318. The first deflection plate 310, the second deflection plate 315 and the third deflection plate 318 may be substantially equally sized. A reference voltage such as a positive 4,000 Volts, may be applied to two of the three deflection plates at any given time such as time X via a power source and/or control unit 205 coupled to each anode tube 300. The remaining deflection plate may comprise a different amount of voltage, such as a plus or minus 100 Volts, such as 4,100 Volts, at any given time, such as time X. The deflection plate being applied the additional 100 volts may be time variant. This will passively steer the vector of an accelerated ion in a nearly random path away from the center axis, (axis B-B') of the anode tube 300 depending on which deflection plate, (the first deflection plate 310, the second deflection plate 315 or the third deflection plate 318) is being applied the additional 100 volts at any given time.

Figure 4A:
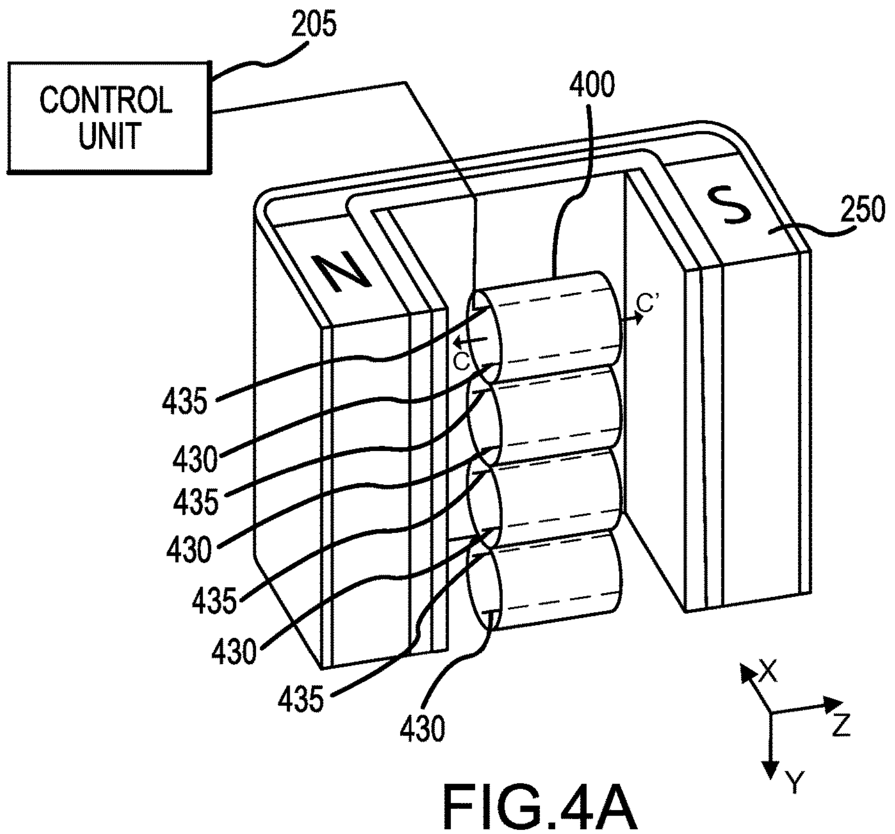
FIG. 4A depicts an isometric view of an ion pump system in accordance with various embodiments.
Figure 4B:
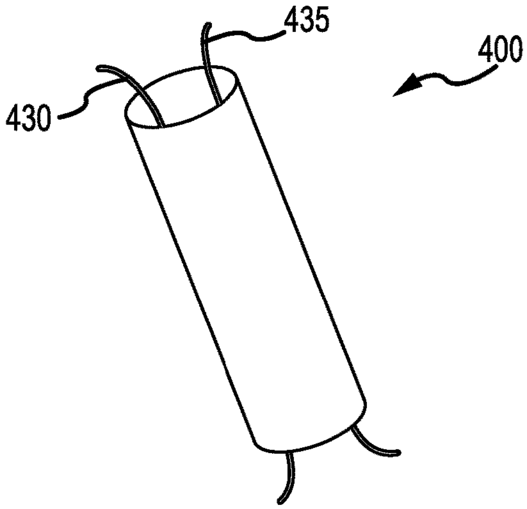
FIG. 4B depicts an isometric view of an ion pump anode tube in accordance with various embodiments.
Figure 4C:
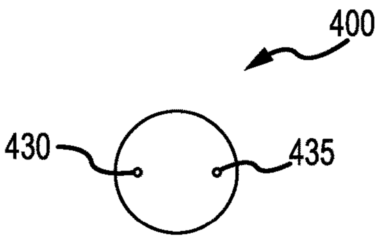
FIG. 4C depicts an end view of an ion pump anode tube of FIG. 4B in accordance with various embodiments.

According to various embodiments and with reference to FIGS. 4A, 4B, and 4C, one or more current carrying wire, such as wires (first wire 430 and second wire 435), may be positioned within a single section anode tube 400. The first wire 430 and second wire 435 may be coupled to a power source and/or control unit 205. The power source and/or control unit 205 may be coupled to each anode tube 400. The single section anode tube may be similar in geometry to conventional anode tubes 100. The direction of travel of the one or more wires may be spiraled, axially aligned with the center axis (axis C-C') of the anode tube 400 and/or randomly positioned. An AC voltage, such as 100 Volts plus or minus from a reference voltage, may be applied to the wires 430 and 435. Stated another way, a periodic voltage may be applied to the wires 430 and 435. This may alter the electric field within the anode tube away from directing an accelerated ion along axis A-A'. An ion formed at any time (and/or thus a particle cloud, such as an electron cloud) may be steered off the mechanical center axis (axis C-C') of each anode tube 400. Moreover, the electron cloud may be steered off axis.

Figure 5A:
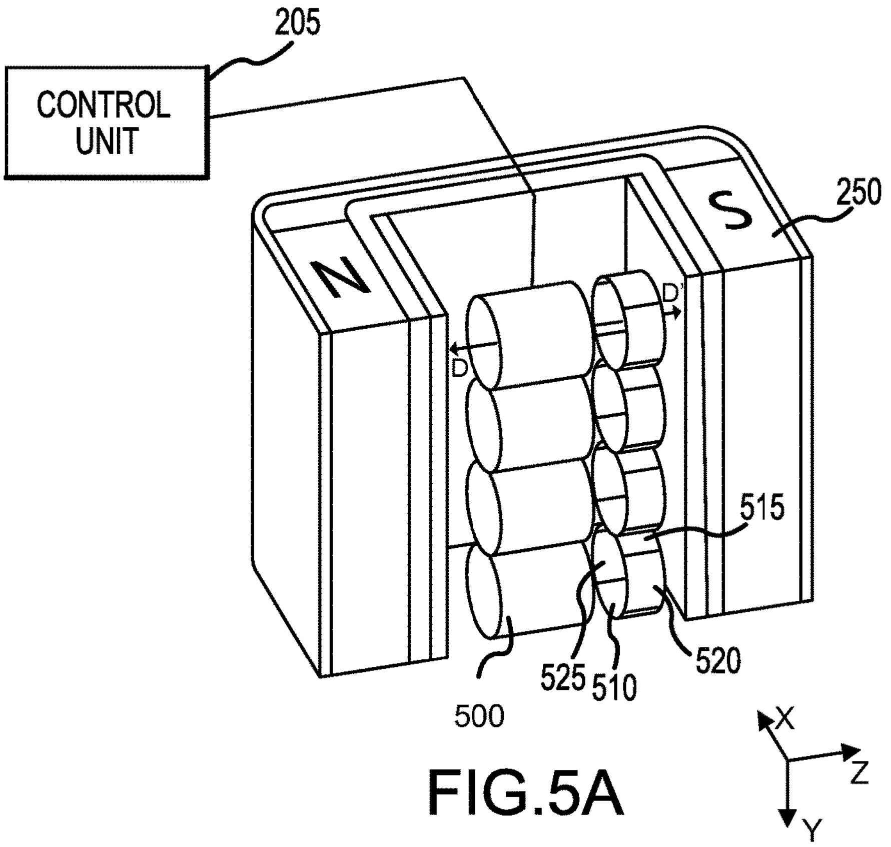
FIG. 5A depicts an isometric view of an ion pump system in accordance with various embodiments.
Figure 5B:
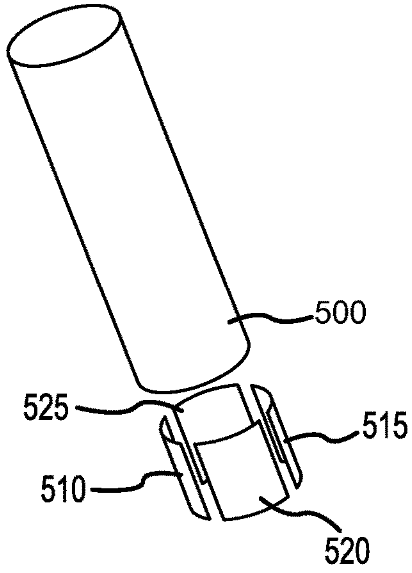
FIG. 5B depicts an isometric view of an ion pump anode tube in accordance with various embodiments.

According to various embodiments and with reference to FIGS. 5A, and 5B, rather than portioning the anode tubes into sections, multiple diffusion plates and/or a plurality of pairs of diffusion plates may be positioned between the anode tube 500 and the cathode plate 250. A reference voltage, such as a positive 4,000 Volts, may be applied to each anode tube 500, via a control unit 205 and/or power source. A small time variant field, such as an AC field of 100 Volts plus or minus from a reference voltage, (e.g., 4,000 Volts), may be applied between a pair of deflection plates, such as between first deflection plate 510 and second deflection plate 515 and/or between third deflection plate 520 and fourth deflection plate 525. Based on the disruption to the electric and magnetic fields, an ion formed at any time may be steered off the mechanical center axis (e.g., axis D-D') of each anode tube 500.

Stated another way, the accelerated ion can be moved after it leaves the anode tube 500 using a secondary electrode disposed between the anode tube 500 and the cathode plate 550. The secondary electrode would be segmented, allowing different time-dependent voltages to be applied to each segment, and configured to alter the electric field within the electrode and steering the accelerated ion as desired.

Three electrodes may be utilized to achieve full X axis and Y axis control of the accelerated ion, and additional segmented electrode designs are also feasible. A common set of steering electrodes could be used for a multi-anode tube ion pump. The accelerated ion may be rasterized systematically across the cathode plate 550 surface at high speed.

Figure 6A:
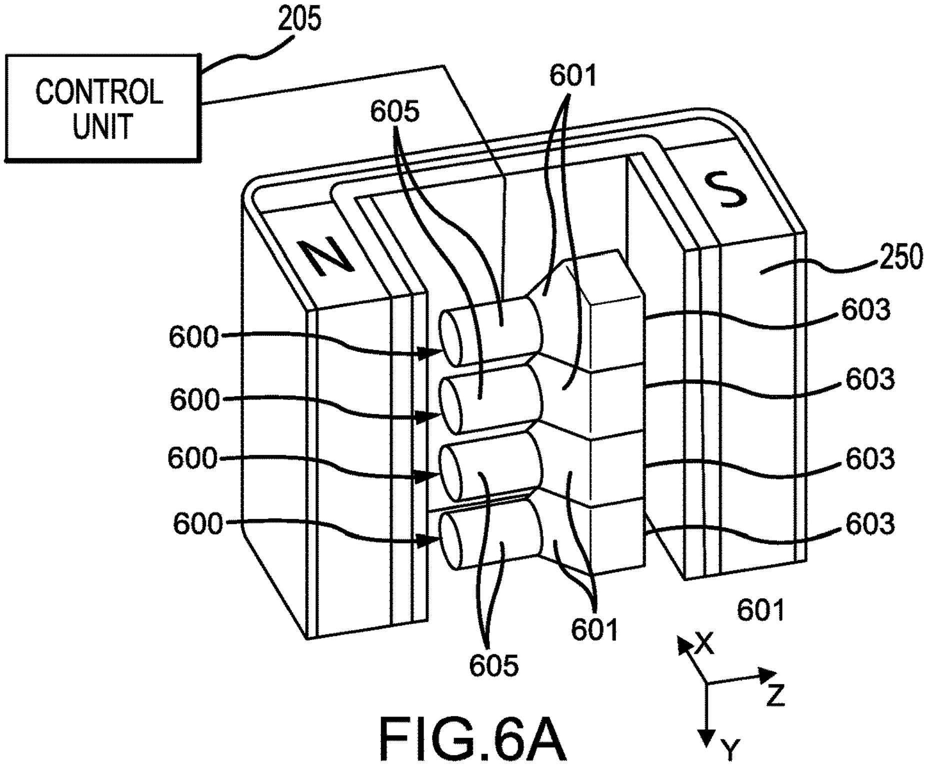
FIG. 6A depicts an isometric view of a ion pump anode tube having a flared aspect in accordance with various embodiments.
Figure 6B:
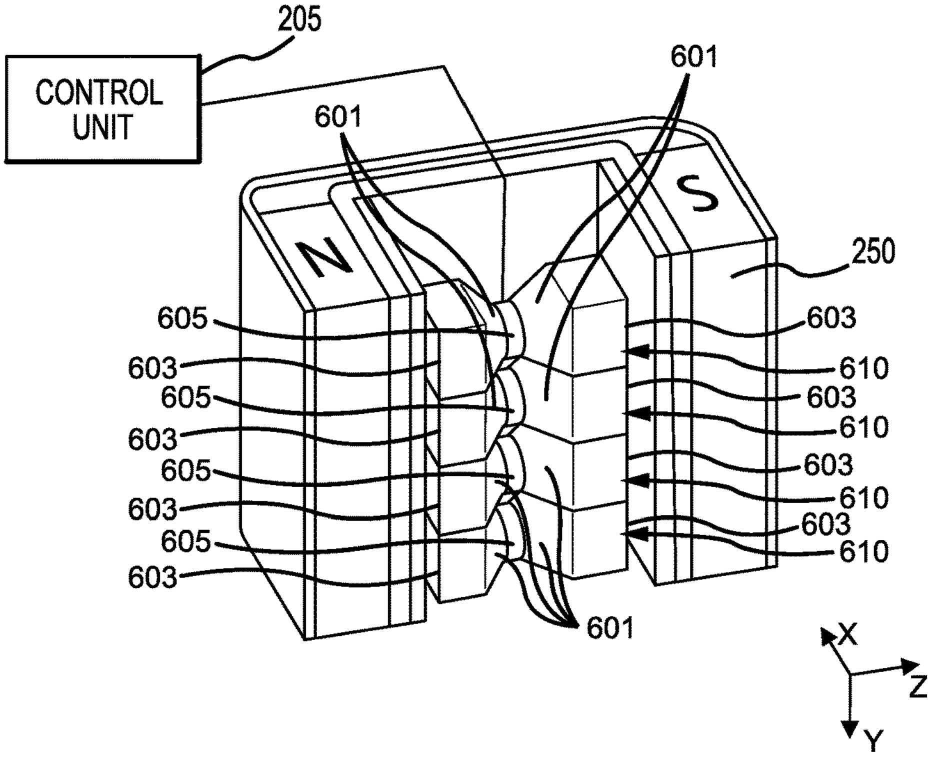
FIG. 6B depicts an isometric view of a ion pump anode tube having dual flared aspects in accordance with various embodiments.

According to various embodiments and with reference to FIGS. 6A-B, the shape of the anode tube 600, 610 along the axial direction can be varied near the ends of the anode tube. In accordance with various embodiments, the various anode tubes disclosed herein may be combined with the principles of FIG. 6A, wherein, for example, the anode tube 600 may include one transition section 601 whereby one or more 603 of the anode tube may have a shape that fills gaps in the end of the array (such as in a 2×4 stacked array shown in FIG. 2) wherein one end 603 would become square as depicted in FIG. 6A to fill the gaps between the cylinder portion 605 of adjacent anode tubes 600. In accordance with various embodiments, the various anode tubes disclosed herein may be combined with the principles of FIG. 6B, wherein, for example, the anode tube 610 may include a transition section 601 at each end 603 of the anode tube 610 whereby each end 603 of the anode tube 610 may have a shape that fills gaps in the end of the array (such as in a 2×4 stacked array shown in FIG. 2) wherein each end 603 would become square as depicted in FIG. 6B to fill the gaps between the cylinder portion 605 of adjacent anode tubes 610. Moreover, with reference to FIGS. 6A-B, an anode tube 600, 610 may comprise any variable shape as desired. For example, the anode tube 600, 610 may be flared to form a larger diameter (such as for a single anode design). In various embodiments, the electric field thus generated near the ends of the anode tube 600, 610 may be radially more diffuse, increasing the radial trajectory of any off-axis ion exiting the anode tube 600, 610 and broadening the impacted cathode area.

Figure 7:
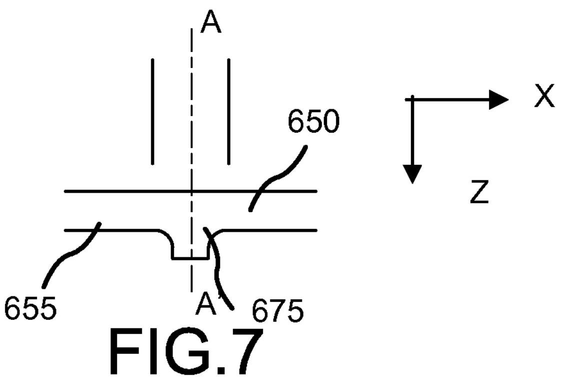
FIG. 7 depicts a cathode having increased material positioned on a back face of the cathode, in accordance with various embodiments.

Thickening the cathode plate 650, with reference to FIG. 7, in desired areas may result in an increased lifespan for the cathode plate and ion pump. While the entire cathode plate 650 may be thickened to increase the lifespan for the cathode plate and ion pump, in some applications the material weight may be undesirable, such as in aerospace applications.

According to various embodiments and with reference to FIG. 7, additional material 675 may be integrally formed in the cathode plate back surface 655, such as the surface farthest to an exit of the anode tube. In this way, additional material 675 formed from the same material and integral to the cathode plate 650 may extend from the cathode plate back surface 655 in a direction along the Z axis away from an exit of the anode tube. The additional material 675 may form a Gaussian toroid shape. The additional material 675 may form a cylinder aligned with the footprint of the anode tube. The additional material 675 may form a symmetrical shape along axis A-A' which may be the mechanical center axis of an anode tube. The additional material 675 may form a cylinder of any desired radius with a center axis aligned with the mechanical center axis A-A' of the anode tube.

Figure 8:
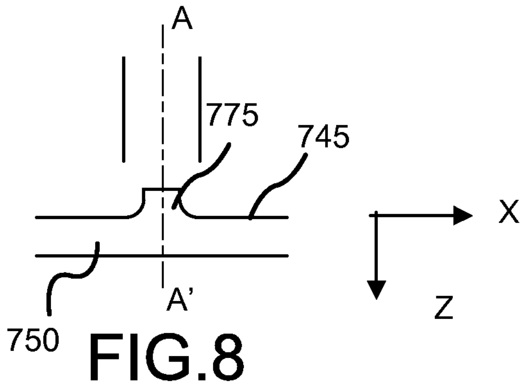
FIG. 8 depicts a cathode having increased material positioned on a front face of the cathode, in accordance with various embodiments.

According to various embodiments and with reference to FIG. 8, additional material 775 may be integrally formed in the cathode plate front surface 745, such as the surface closest to an exit of the anode tube. In this way, additional material 775 formed from the same material and integral to the cathode plate 750 may extend from the cathode plate front surface 745 in a direction along the Z axis proximate from an exit of the anode tube. The additional material 775 may form a Gaussian toroid shape. The additional material 775 may form a cylinder aligned with the footprint of an anode tube. The additional material 775 may form a symmetrical shape along axis A-A' which may be the mechanical center axis of an anode tube. The additional material 775 may form a cylinder of any desired radius with a center axis aligned with the mechanical center axis A-A' of the anode tube.

Figure 9:
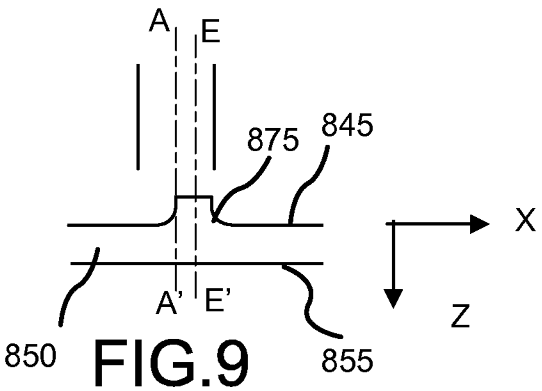
FIG. 9 depicts a cathode having increased material positioned off a centerline axis of the anode tube, in accordance with various embodiments.

According to various embodiments and with reference to FIG. 9, additional material 875 may extend in a direction along the Z axis from the cathode plate front surface 845 or cathode plate back surface 855. The additional material 875 may be generally symmetrical about additional material 875 along a centerline E-E', wherein the centerline is offset from the mechanical center axis of the anode tube A-A'.

A cathode plate with an extension that is offset from the mechanical center axis of the anode tube A-A' distorts the electric field felt by the incoming accelerated ion. Thus, the vector of the accelerated ion is off center. Over time, the ions will impact the additional material 875. The ions will impact the additional material 875 a relatively higher percentage of the time near the mechanical center axis of the anode tube A-A' but offset from the mechanical center axis of the anode tube A-A'. Over time, the additional material 875 may be ablated away, which will alter the shape of the electric field experienced by incoming accelerated ions. In this way, by ablating the additional material 875 over time, the electric field experienced by incoming accelerated ions is passively changed. Thus, the accelerated ions will be steered into different sections of the cathode plate 850, generally within the footprint of the anode tube over time.

In this way the deformity to the cathode surface (e.g., the additional material 875), may be axially asymmetric to the ion beam axis A-A'. This arrangement may be configured to distort the electric field and alter the trajectory of the accelerated ion. As the accelerated ion interacts with and/or ablated the additional material 875 with the cathode over time and material is removed, the deformity will be altered as well, changing the local electric field, and consequently, the trajectory of the accelerated ion.

The concepts described herein may apply to terrestrial ion pumps and/or aerospace based ion pumps, such as sputter ion pumps.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more."

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Different cross-hatching is used throughout the figures to denote different parts but not necessarily to denote the same or different materials.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. An ion pump comprising:

an anode tube and a cathode plate, wherein a mechanical axial center axis of the anode tube intersects the cathode plate, wherein a plurality of deflection plates are disposed around the mechanical axial center axis, wherein the plurality of deflection plates define longitudinally extending divisions that extend parallel to the mechanical axial center axis between adjacent deflection plates of the plurality of deflection plates, wherein a time variant electric current is configured to be applied to the plurality of deflection plates to alter the trajectory of accelerated ions moving toward the cathode plate, wherein the cathode plate comprises a front surface and a back surface.

2. The ion pump of claim 1, wherein the cathode plate further comprises an additional material extending from the front surface, wherein the cathode plate is located in proximity to the anode tube, wherein the front surface is in closer proximity to the anode tube than the back surface, wherein the additional material is contained within a footprint defined by and projected to the cathode plate from an open end of the anode tube along an axis.

3. The ion pump of claim 2, wherein the additional material forms a substantially symmetrical shape along an axial center axis in a Z direction.

4. The ion pump of claim 3, wherein the axial center axis is collocated with the mechanical axial center axis of the anode tube.

5. The ion pump of claim 3, wherein the axial center axis is asymmetric with the mechanical axial center axis of the anode tube.

6. The ion pump of claim 5, wherein a positon of the axial center axis of the additional material is configured to change a local electric field and a trajectory of accelerated ions over time by varying an electric field as material of the additional material is ablated by accelerated ions.

7. The ion pump of claim 2, wherein the additional material is integrally formed with the cathode plate.

8. An ion pump comprising:

an integral anode tube and a cathode plate, wherein a mechanical axial center axis of the integral anode tube intersects the cathode plate, wherein the cathode plate comprises:

a front surface; and a back surface;

wherein at least one of:

an additional material extends from the back surface the cathode plate, wherein the cathode plate is located in proximity to the integral anode tube, wherein the front surface is in closer proximity to the integral anode tube than the back surface; and the integral anode tube has an integral shape transition section, wherein the integral shape transition section is a middle portion between two end portions of the integral anode tube, wherein the two end portions have different cross-sectional shapes.

9. The ion pump of claim 8, wherein the additional material is contained within a footprint defined by and projected to the cathode plate from an open end of the integral anode tube along an axis.

10. The ion pump of claim 8, wherein the additional material forms a substantially symmetrical shape along an axial center axis in a Z direction.

11. The ion pump of claim 10, wherein the axial center axis is collocated with the mechanical axial center axis of the integral anode tube.

12. The ion pump of claim 10, wherein the axial center axis is asymmetric with the mechanical axial center axis of the integral anode tube.

13. The ion pump of claim 12, wherein a positon of the axial center axis of the additional material is configured to change a local electric field and a trajectory of accelerated ions over time by varying an electric field as material of the additional material is ablated by accelerated ions.

14. The ion pump of claim 8, wherein the additional material is integrally formed with the cathode plate.

15. The ion pump of claim 8, wherein the additional material is configured to extend a lifespan of the ion pump.

16. The ion pump of claim 1, wherein the anode tube is longitudinally segmented so as to have the plurality of deflection plates.

17. The ion pump of claim 1, wherein the plurality of deflection plates are disposed between the anode tube and the cathode plate.

18. The ion pump of claim 1, wherein the plurality of deflection plates comprises opposing pairs of deflection plates, wherein the opposing pairs are disposed on radially opposite sides of the mechanical axial center axis of the anode tube.

19. An ion pump comprising:

an anode tube;

a cathode plate; and a wire extending within and completely through the anode tube;

wherein a mechanical axial center axis of the anode tube intersects the cathode plate, wherein a time variant electric current is configured to be applied to the wire to alter the trajectory of accelerated ions moving toward the cathode plate.

20. The ion pump of claim 19, wherein the wire is a first wire, wherein the ion pump comprises a second wire extending within and through the anode tube.

* * * * *